United States Patent [19]
Graham

[11] Patent Number: 5,882,425
[45] Date of Patent: Mar. 16, 1999

[54] COMPOSITION AND METHOD FOR PASSIVATION OF A METALLIZATION LAYER OF A SEMICONDUCTOR CIRCUIT AFTER METALLIZATION ETCHING

[75] Inventor: Sandra W. Graham, Kalispell, Mont.

[73] Assignee: Semitool, Inc., Kalispell, Mont.

[21] Appl. No.: 788,043

[22] Filed: Jan. 23, 1997

[51] Int. Cl.[6] ............................ H01L 21/302; B08B 6/00
[52] U.S. Cl. ............................ 134/1.3; 438/750; 438/754
[58] Field of Search ............................ 134/1.3; 216/100, 216/102, 104; 438/750, 754

[56] References Cited

U.S. PATENT DOCUMENTS

| | | | |
|---|---|---|---|
| 4,749,640 | 6/1988 | Tremont et al. | 430/314 |
| 5,175,124 | 12/1992 | Winebarger | 437/180 |
| 5,451,291 | 9/1995 | Park et al. | 134/2 |
| 5,676,760 | 10/1997 | Aoki et al. | 134/2 |

FOREIGN PATENT DOCUMENTS

| | | |
|---|---|---|
| 0731498 | 9/1996 | European Pat. Off. . |
| 3-155630 | 7/1991 | Japan . |

OTHER PUBLICATIONS

Scully et al., *Localized Corrosion of Sputtered Aluminum and Al–0.5* Cu Alloy Thin Films in Aqueous HF Solution, II. Inhibition by $CO_2$, J. Electrochem. Soc., vol. 137, No. 5, May 1990, 1373–1377.

Scully et al., *Localized Corrosion of Sputtered Aluminum and Al–0.5* Cu Alloy Thin Films in Aqueous HF Solution, I. Corrosion Phenomena, J. Electrochem. Soc., vol. 137, No. 5, May 1990, 1365–1372.

"Aqueous Ozone Cleaning of Silicon"; abstract only; Tong et., al.; 1992; Proc.—Elect. Soc.; 92–12;ISSN:0161–6374.

*Primary Examiner*—William Powell
*Assistant Examiner*—George Goudreau
*Attorney, Agent, or Firm*—Rockey, Milnamow & Katz, Ltd.

[57] ABSTRACT

A semiconductor wafer subject to a metallization etching process includes post-etching residue that is removed using a fluorine containing solution having a substantial amount of $CO_2$ dissolved therein. Alternatively, or in addition, a fluorine containing solution, or the like, that has been used to remove the residue is rinsed from the wafer using a solvent containing a substantial amount of $O_3$ dissolved therein. In each instance, pitting of the metallization layer is reduced.

28 Claims, 1 Drawing Sheet

5,882,425

COMPOSITION AND METHOD FOR PASSIVATION OF A METALLIZATION LAYER OF A SEMICONDUCTOR CIRCUIT AFTER METALLIZATION ETCHING

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

Numerous sequential processes are used in the manufacture of semiconductor integrated circuit devices. One such process is the etching of the metallization that has been deposited on the semiconductor wafer from which the integrated circuit is formed.

Aluminum is the most commonly used metallization on silicon integrated circuits. It is often alloyed with silicon and/or copper to improve its properties, in particular to meet the process and reliability requirements imposed upon it by the device manufacturer. However, such alloying increases the metallization layer's susceptibility to corrosion. The most common corrodants are the dissociation products of plasma etch containing chlorine and fluorine and wet etches containing HF. Since the dimensions of state-of-the art metallizations are on the order of 0.9 microns or less, the smallest pits resulting from the corrosion can seriously affect the electrical properties of the device and can even cause complete failure of the circuit. Such conventional etching processes also leave behind organo-metallic residue that must be removed in a subsequent wafer processing step that further contributes to the problem of pitting.

Removal of the organo-metallic residue has conventionally been achieved through application of one of two basic types of solutions. The first solution type is an ethylene glycol based solution including, for example, low concentration HF. The second solution type is a water-based solution including, for example, a concentration of $NH_4F$. With respect to the second solution type, the higher the aqueous concentration of the $NH_4F$, the more effective the solution is at removing the undesired organo-metallic residue from the wafer. However, higher concentrations of the $NH_4F$ also increase the likelihood and degree of pitting of the metallization layer. Substantial pitting from the $NH_4F$ has also been observed at low $NH_4F$ concentrations.

The present inventor has recognized this problem and has developed a method and solution for effectively removing the undesired organo-metallic residue from the wafer surface while significantly decreasing the likelihood and degree of pitting.

BRIEF SUMMARY OF THE INVENTION

A semiconductor wafer subject to a metallization etching process includes post-etching residue that is removed using a fluorine containing solution having a substantial amount of $CO_2$ dissolved therein. Alternatively, or in addition, a fluorine containing solution that has been used to remove the residue is rinsed from the wafer using a solvent containing a substantial amount of $O_3$ dissolved therein. In each instance, pitting of the metallization layer is reduced.

DETAILED DESCRIPTION OF THE INVENTION

Figure 1:
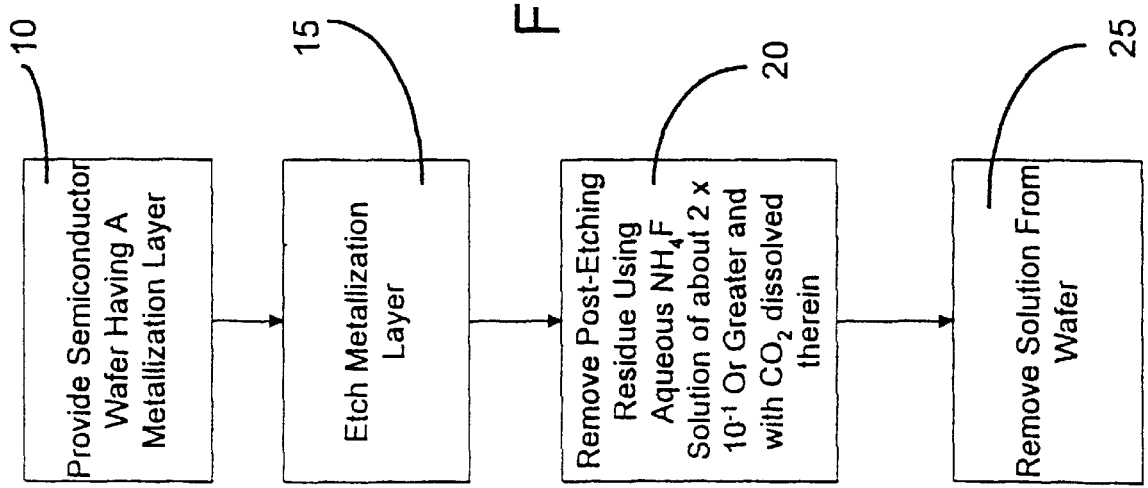
FIG. 1 is a flow diagram of a post-etching residue removing process in accordance with one embodiment of the present invention.

FIG. 1 is a flow diagram illustrating one embodiment of a process including effective removal of post-etching residue while concurrently reducing and/or eliminating pitting that would otherwise result therefrom. As shown, a semiconductor wafer with a metallization layer is provided at step 10. The metallization layer may, for example, be any one or combination of a number of metallization materials. Such materials include aluminum, aluminum alloys, etc. Commonly used aluminum alloys include an alloy of aluminum and copper.

At step 15, the metallization layer is etched to form the desired metallization pattern. The etching of the metallization layer results in a residue that must be removed from the semiconductor wafer. Such residues are typically organo-metallic residues.

Removal of the residues ensues at step 20. At step 20, a novel and effective solution is applied to the semiconductor wafer. More particularly, an aqueous solution of $NH_4F$ is applied to the wafer. The aqueous solution has an $NH_4F$ concentration of at least about $2 \times 10^{-1}$ or greater and contains an amount of $CO_2$ dissolved therein. The amount of dissolved $CO_2$ is sufficiently large so that pitting of the metallization layer is substantially reduced when compared to an aqueous $NH_4F$ solution that does not contain dissolved $CO_2$. Preferably, the solution is substantially saturated with $CO_2$. The $CO_2$ may be dissolved in the aqueous solution through, for example, sparging. Such sparging may take place at room temperature, at a rate of 1 liter/minute at 20 psi for about 1 hr. The solution may be applied, for example, by a spray solvent system or a spray acid system.

After treatment with the foregoing solution, the solution is removed from the semiconductor wafer at step 25. For example, the wafer may be cleaned using a spray of de-ionized water, or the like. Alternatively, the solution may be removed by an intermediate rinse chemical such as IPA.

Figure 2:
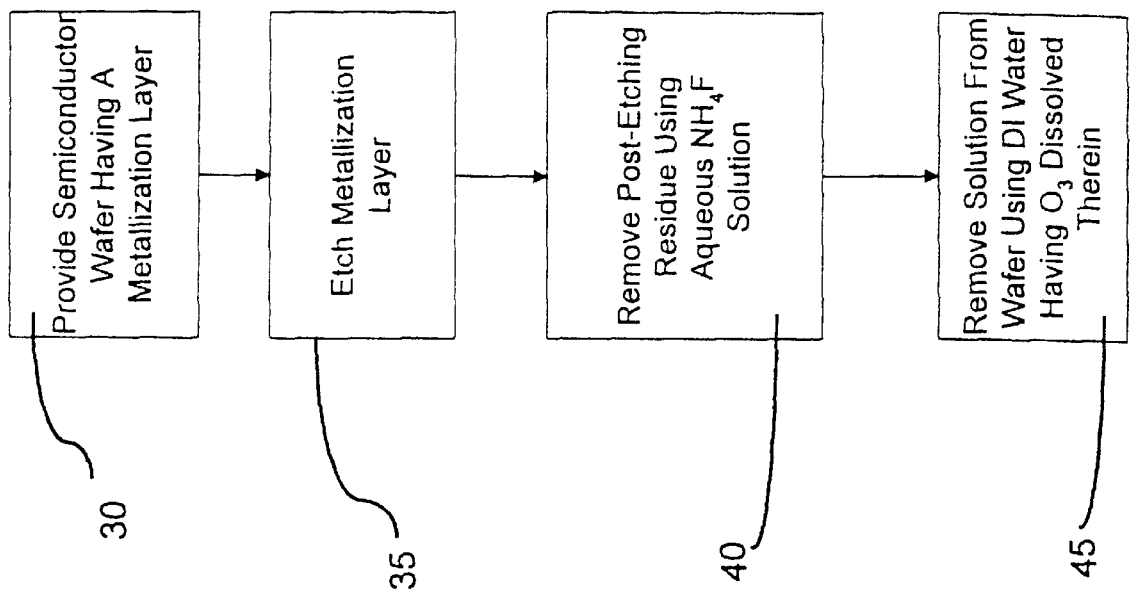
FIG. 2 is a flow diagram of a post-etching residue removing process in accordance with a further embodiment of the present invention.

FIG. 2 is a flow diagram illustrating a further embodiment of a process including effective removal of post-etching residue while concurrently reducing and/or eliminating pitting that would otherwise result therefrom. In accordance with this embodiment, a semiconductor wafer with a metallization layer is provided at step 30. As noted above, the metallization layer may, for example, be any one or combination of a number of metallization materials. Such materials include aluminum, aluminum alloys, etc. Commonly used aluminum alloys include an alloy of aluminum and copper.

At step 35, the metallization layer is etched to form the desired metallization pattern. The etching of the metallization layer results in a residue that must be removed from the semiconductor wafer. Such residues, as previously noted, are typically organo-metallic residues.

Removal of the residues ensues at step 40. At step 40, a fluorine containing aqueous solution is applied to the semiconductor wafer. Other solutions suitable for such use include: ethylene glycol and fluorine solutions, propylene glycol and fluorine solutions, hydroxylamine solutions, dimethylsulfoxide solutions, monoethanolamine solutions, and the like. In the particular embodiment illustrated here, an aqueous solution of $NH_4F$ is applied to the wafer. The aqueous solution has an NH4F concentration of at least about $2\times10^{-1}$M or greater and, may contain a concentration as large as 0.5 to 1.0M. Solutions with higher concentration levels assist in removing the post-etching residue more effectively than those with lower concentration levels. Although not necessary, the solution may be one such as the one described above in connection with FIG. 1 and contain an amount of $CO_2$ dissolved therein.

After treatment with the foregoing solution, the solution is removed from the semiconductor wafer at step 40 using a unique rinsing solution. More particularly, the rinsing solution comprises a solvent that is capable of removing the fluorine containing solution; the rinsing solution having an amount of $O_3$ dissolved therein. Preferably, the solvent is de-ionized water that is substantially saturated with $O_3$. The $O_3$ may, for example, be introduced into the solution through a sparging process. By using this rinsing solution, pitting of the metallization layer is substantially reduced when compared to the pitting that would otherwise occur if a solvent, such as de-ionized water, alone were used in the rinsing process.

Numerous modifications may be made to the foregoing process without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

I claim:

1. A process for removing post-etching residue resulting from the etching of a metallization layer of a semiconductor wafer, the process comprising:

applying to the wafer a solution comprising an aqueous solution of $NH_4F$ having an $NH_4F$ concentration of at least $2\times10^{-1}$M or greater, the solution containing a substantial amount of $CO_2$ dissolved therein.

2. A process as claimed in claim 1 and further comprising the step of removing the solution from the surface of the wafer after application thereof.

3. A process as claimed in claim 1 wherein the metallization layer comprises aluminum.

4. A process as claimed in claim 1 wherein the metallization layer comprises an aluminum alloy.

5. A process as claimed in claim 1 wherein the metallization layer comprises an alloy of aluminum and copper.

6. A process as claimed in claim 1 wherein the solution is saturated with $CO_2$.

7. A process for removing post-etching residue resulting from the etching of a metallization layer of a semiconductor wafer, the process comprising:

applying to the wafer a solution comprising an aqueous solution of $NH_4F$; and rinsing the solution off of the wafer using de-ionized water that contains a substantial amount of $O_3$ dissolved therein.

8. A process for removing post-etching residue as claimed in claim 7 wherein the de-ionized water is substantially saturated with the $O_3$.

9. A process for removing post-etching residue as claimed in claim 8 wherein the solution comprises an aqueous solution of $NH_4F$ having an $NH_4F$ concentration of at least $2\times10^{-1}$M or greater.

10. A process for removing post-etching residue as claimed in claim 8 wherein the solution comprises an aqueous solution of $NH_4F$ having an $NH_4F$ concentration of at least $5\times10^{-1}$M or greater.

11. A process for removing post-etching residue as claimed in claim 8 wherein the metallization layer comprises aluminum.

12. A process for removing post-etching residue as claimed in claim 8 wherein the metallization later comprises an aluminum alloy.

13. A process for removing post-etching residue as claimed in claim 8 wherein the metallization layer comprises an alloy of aluminum and copper.

14. A process for removing post-etching residue resulting from the etching of a metallization layer of a semiconductor wafer, the process comprising:

applying a fluorine containing solution to the wafer and a metallization layer disposed thereon; and rinsing the solution off of the wafer and the metallization layer using a solvent for the fluorine containing solution, the solvent containing an amount of $O_3$ dissolved therein.

15. A process for removing post-etching residue as claimed in claim 14 wherein the fluorine based solution comprises an aqueous solution of $NH_4F$ having an $NH_4F$ concentration of at least $2\times10^{-1}$M or greater.

16. A process for removing post-etching residue as claimed in claim 14 wherein the fluorine based solution comprises an aqueous solution of $NH_4F$ having an $NH_4F$ concentration of at least $5\times10^{-1}$M or greater.

17. A process for removing post-etching residue as claimed in claim 15 wherein the solvent is de-ionized water.

18. A process for removing post-etching residue as claimed in claim 17 wherein the de-ionized water is at least substantially saturated with the $O_3$.

19. A process for removing post-etching residue as claimed in claim 16 wherein the solvent is de-ionized water.

20. A process for removing post-etching residue as claimed in claim 19 wherein the de-ionized water is at least substantially saturated with the $O_3$.

21. A process for removing post-etching residue as claimed in claim 14 wherein the solvent is de-ionized water.

22. A process for removing post-etching residue as claimed in claim 21 wherein the de-ionized water is at least substantially saturated with the $O_3$.

23. A process for removing post-etching residue resulting from the etching of a metallization layer of a semiconductor wafer, the process comprising:

applying to the wafer a solution comprising an aqueous solution of $NH_4F$ having an $NH_4F$ concentration of at least $2\times10^{-1}$M or greater, the solution containing a substantial amount of $CO_2$ dissolved therein; and rinsing the solution off of the wafer using de-ionized water that contains a substantial amount of $O_3$ dissolved therein.

24. A process as claimed in claim 23 wherein the $NH_4F$ solution is substantially saturated with $CO_2$.

25. A process as claimed in claim 23 wherein the de-ionized water is substantially saturated with $O_3$.

26. A process as claimed in claim 23 wherein the metallization layer comprises aluminum.

27. A process as claimed in claim 23 wherein the metallization layer comprises an aluminum alloy.

28. A process as claimed in claim 23 wherein the metallization layer comprises an alloy of aluminum and copper.

* * * * *